United States Patent [19]
Beahm et al.

[11] Patent Number: 5,920,486
[45] Date of Patent: Jul. 6, 1999

[54] PARAMETERIZED CELLS FOR GENERATING DENSE LAYOUTS OF VLSI CIRCUITS

[75] Inventors: Martin Emery Beahm, Carmel, N.Y.; Terry Ivan Chappell, Portland, Oreg.; Rajiv Vasant Joshi, Yorktown Heights, N.Y.

[73] Assignee: International Business Machines Corporation, Armonk, N.Y.

[21] Appl. No.: 08/699,095
[22] Filed: Aug. 16, 1996
[51] Int. Cl.⁶ .............................. G06F 17/00; G06F 17/50
[52] U.S. Cl. ..................... 364/491; 364/490; 364/489; 364/488
[58] Field of Search ............................ 364/488–491, 364/578; 395/500

[56] References Cited

U.S. PATENT DOCUMENTS

| | | | |
|---|---|---|---|
| 4,700,316 | 10/1987 | Nair | 364/488 |
| 4,713,773 | 12/1987 | Cooper et al. | 364/491 |
| 4,914,612 | 4/1990 | Beece et al. | 364/578 |
| 5,029,102 | 7/1991 | Drumm et al. | 364/489 |
| 5,432,707 | 7/1995 | Leung | 364/489 |
| 5,666,288 | 9/1997 | Jones et al. | 364/490 |
| 5,737,236 | 4/1998 | Maziasz et al. | 364/490 |
| 5,818,727 | 10/1998 | Sekiguchi | 364/490 |

Primary Examiner—Kevin J. Teska
Assistant Examiner—Vuthe Siek

[57] ABSTRACT

The invention provides a technique, given a netlist containing a description of the terminal connections and the length and width of each device in a circuit, for automatically producing a layout for each device in that circuit.

21 Claims, 7 Drawing Sheets

PARAMETERIZED CELLS FOR GENERATING DENSE LAYOUTS OF VLSI CIRCUITS

FIELD OF THE INVENTION

The invention relates to an automated method for generating a layout of a VLSI circuit.

BACKGROUND OF THE INVENTION

The manufacture of semiconductor chips requires the use of masks that are derived from the physical design of the chips. Physical design, however, is a very laborious and time consuming process. The process typically involves synthesizing control logic circuits into a gate level design, retrieval of the gate's characteristics from a design library for the technology, and arrangement of the gates in a desired configuration using appropriate placement and routing tools. One method for placing the components of a memory circuit is the technique of manually drawing polygons that represent these components. One problem with this technique, however, is the unavailability of any means for continuous tuning of the circuit in response to changes in the dimensions of the circuit (e.g., changes of width, length, ground and power busses, etc.). If the logic or design changes in the midst of the design cycle, it is difficult to change the already finished layout. Clearly, present techniques provide insufficient performance and automation for today's needs.

The polygon approach, also known as "polygon pushing", presents throughput problems, is extremely error prone, requires iterative verification, is technology-dependent, can not be compacted and is difficult to reuse. Also, graphical hand drawn polygon representations are difficult to parameterize unless the polygon shape manipulation is software controlled. Further, the ability to adjust layout at the gate level is not available.

It can be seen, therefore, that alternative methods are needed to improve the circuit designer's productivity.

SUMMARY OF THE INVENTION

One aspect of the invention is a method for automatically generating a layout of a VLSI circuit, comprising the computer implemented steps of:

inputting a data file describing the circuit;

computing one or more parameters of the layout;

responsive to the computation of one or more parameters, creating shapes representing components of the circuit;

placing the shapes in an appropriate configuration;

if shared, anded or stacked devices are present in the circuit:
  calculating the shape and position and the configuration of such devices;

creating the final pull-up or pull down tree structure by position and configuration thus yielded in the above fashion, or in other words computing an overlay position for the stacked devices;

generating the wiring connections and configuration to connect the devices in the layout in the desired or custom fashion;

outputting a layout of the circuit.

DETAILED DESCRIPTION OF THE PREFERRED EMBODIMENTS

The algorithms used in this invention help to create dense layouts with increased productivity. The complex circuits can be laid out to achieve high density, to reduce area and power. This is achieved through the use of programmable cells which are programmed based on algorithms which create complex device shapes with respect to a corresponding device netlist. The invention includes a procedure for generating complex layouts at device or gate levels to optimize parasitics.

Thus, the invention is directed to a technique for automatically generating dense VLSI circuit layouts. The invention employs novel "programmable" cells (or "p-cells") for this purpose, which allows the generation of custom or semi-custom layouts at the device or gate level. By specifying the width and length of a device, and/or other device options, the p-cells can automatically be placed and routed based on the connectivity of the devices in the layout. The method in accordance with the invention also makes possible the generation, on the fly, of gate level structures. Thus, the invention can be used at both the device and gate levels.

Figure 1:
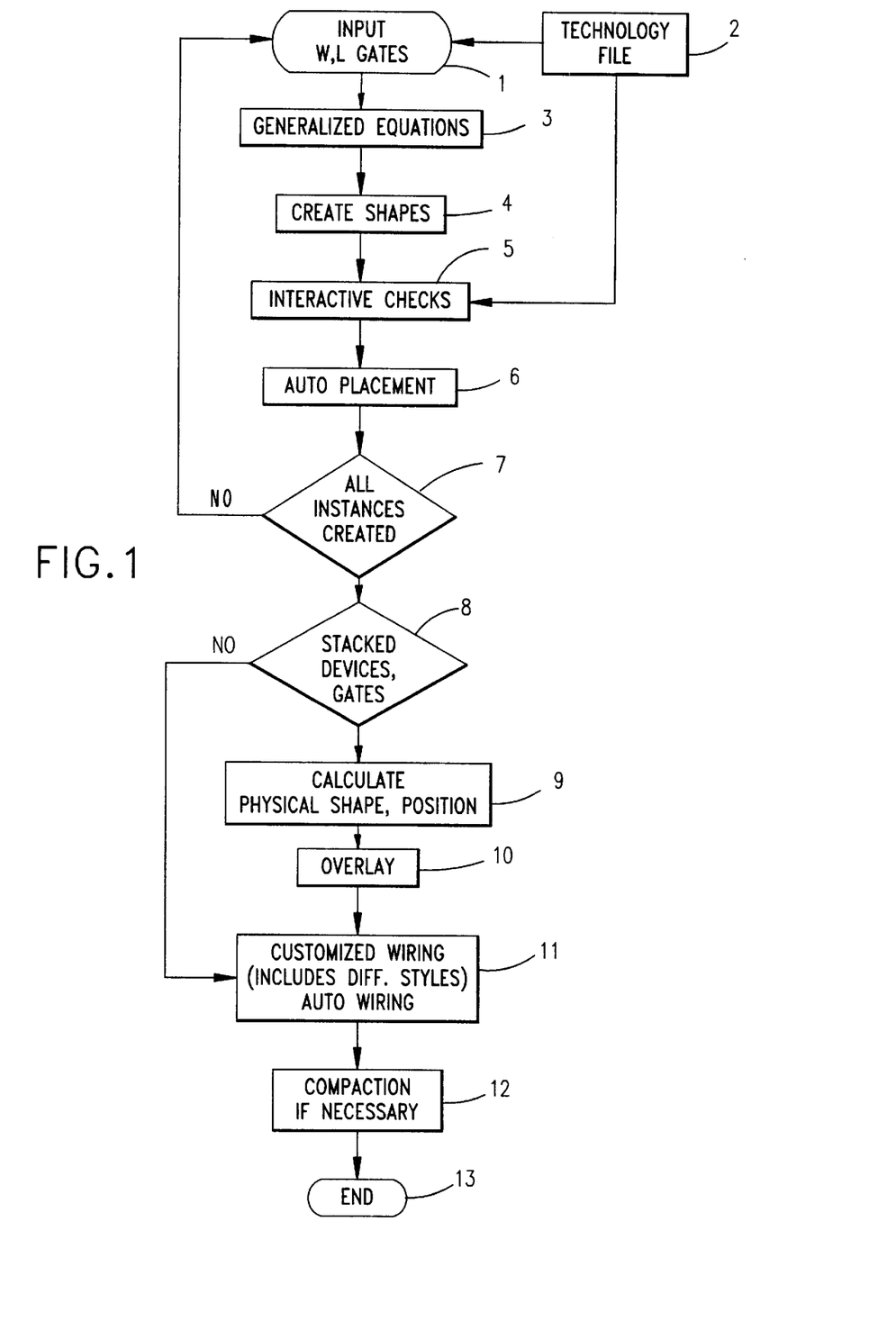
FIG. 1 is a flow diagram describing a method for automatically generating the layout of a VLSI circuit in accordance with the invention.

A description of a method in accordance with the invention for use with device level descriptions is given in FIG. 1. (See also Appendix A.)

As shown at step 1 of FIG. 1, the input to the system comprises data including the width (W) of the device, the length (L) of the device, and the number of gates or fingers (M) in the device. M is optional, and if not provided by the circuit designer, is computed by the method of the present invention, for instance, by dividing W by the critical length of the device. For example, if W is 100 and the critical length is 10, then the method will assign M=10. This information is provided in the form of an array of data (net list), readable by a program implementing a method in accordance with the invention. A further input could be the device type. Device types include, but are not limited to: an interdigitated device ("i" device), a shared AND device ("sa" device), an AND device ("a" device), a shared tapered device ("st" device), a device tapered on both sides ("tt" device), a device which is tapered on one side ("t" device), or a normal device ("n" device) wherein gate or m equals 1. Those skilled in the art will recognized that other device type parameters can also be input.

Also provided as an input is a technology file, as shown at block 2, which defines the ground rules for the technology and identifies the layers in the chip to be designed. Each layer is numbered, and for each number, the substance of that layer is identified. For example, layer 1 might be ROX, layer 2 PC, etc. The ground rules include such information as minimum spacing between devices and wires, and other conventions particular to the technology.

At step 3 of FIG. 1, a series of generalized equations are called in order to compute various parameters of the device layout. One parameter computed during this step is pitch. For interdigitated devices, the pitch is the distance between the drains of neighboring devices, and will depend on the odd-even configuration of the gate. Another parameter that is computed is the distance between the gates located farthest apart from one another. This distance determines the length of wires used to tie all gates on a device. Also computed is the distance between the MC (metal contacts) bars of the circuit. The length of the MC bars is also computed. Further, the location of contacts to be placed on the MC bars, the vertical and horizontal spacing ("stepping") between contacts on a single bar and between contacts on adjacent bars are computed. The same information as was computed for MC bar is also computed with minor modifications for the M1 layer that is placed on the contacts. The M1 layer is a first level wire which has roughly the same shape as the fingers or gates in the device. The generalized equations also compute the horizontal portion of the M1 wire to connect sources separately and the same will be done to connect the drains in a manner such that the M1 wires connecting the drains do not come into contact with the M1 horizontal wires connecting the sources. The generalized equations also compute the position of "protect" diodes with respect to edges of the device (for instance, the protect diodes distance between adjacent or neighboring gates will be computed). The generalized equations also compute the distance between the substrate contact for each device and the source of the device. The generalized equations will also compute the size and location of flanges (i.e., gate contacts) contacting the gates, and whether the equations will also compute whether the flange is to be a straight flange, a drain side flange or a source side flange, with the latter being characterized by the direction in which the contact or flange points, i.e., either to the drain or source. The equations can also compute the dimension and location of a connector between the gates which comprise polysilicon and MC bar. The generalized equations can also, when given a desired length and position of MC bar, compute the position and number of contacts that will connect MC bar and the source or drain, as the case may be. Further equations are described in the attached appendix.

With the use of generalized equations/algorithms, device shapes in the form of layout can be manipulated by providing interactive checks. The p-cells can be custom placed, or placed using timing information or delay information until all devices are created. The stacked devices or gates can be formed with a stacking algorithm and technology constraints. These devices can be overlaid and compacted if necessary.

Input to the generalized equations is provided from step 1 in the form of digital schematics, which are provided as input to the system. The schematics are tuned or continuously tuned to their load. If the dimensions, especially width, are greater than critical dimensions (where the critical dimension is dependent on the source-drain-gate resistance), the gate resistance is minimized automatically by breaking the device into "i" devices. If the devices are shared at the same node, information such as the device type is provided as the input to the equations. The generalized equations take this input and generate the width/finger, distance between two fingers, and recessed oxide distance, depending on the device type and based on the technology file.

Examples of the generalized equations are as follows (the rest can be found in the code listed in the attached Appendix):

No. of sources=(gates+1)/2(if the number of gates is odd) =(gates+2)(if gates even)

Gate pitch=distance between two gates, which is a function of gate length

Source pitch=2× gate pitch.

Using the inputs such as gate pitch and number of times the source repeats, the generalized equations can generate a complete layout for the "i" devices. The gates can be vertically stretched using a parameterized equation. Similarly, the contacts on source-drain, and gate length and width are calculated, e.g., the source contact—the parameters such as stepping distance in Y direction are provided from the technology file, however the stepping distance in the X direction is calculated based upon the source pitch. For gate buses (which strap all gates of the same devices) the distances are calculated through the generalized equation:

$$gate\_pitch \times (gates-1) + gate\_Length - compensating\ factor).$$

The data generated in the generalized equations block 3 is passed to a layout editor in block 4 where the shapes of the layout are generated. A suitable layout generator is the Virtuoso (TM) layout data base developed by Cadence. The output of create the shapes block 4 is a visual display of the shapes of the layout.

In the interactive checks step 5, the method in accordance with the invention will check for ground rule violations in the layout of a circuit or device, for instance, which may have occurred as a result of manual placement components or features in the layout by the user that may violate design rules. The interactive checks may also include cross checking between the schematic and the layout for missing devices that appear in the schematic but not in the layout. It does this by referencing the net list representing the schematic. For instance, if devices are identified by name, it will check by name to make sure that all named devices in the net list appear in the layout. The design rule violation checks are performed by executing an "if-then" loop which insures that the new feature to be added does not violate any of the ground rules for the technology.

At step 6, auto placement of the layout of each of the devices in the schematic is performed. The placement can be determined by one of two factors. First, placement may depend upon the placement of the devices in the schematic drawing, in which case the devices would be placed in their same relative position as in the schematic. The placement is based on $$Xpitch = width\ of\ the\ device + minimum\ spacing);\ and\ Ypitch = minimum\ y\ spacing.$$

Another technique for auto placement is to place based on delay information of the net, that is, so as to minimize the RNC (wiring delay) produced by the wires connecting the devices. They are placed so as to minimize the wire delay connecting the devices.

In step 7, the method tests whether or not all instances of devices in the net list or schematic have been created in the layout. If not, then the method returns to step 1 to take more input. Therefore, the devices in the net list are treated serially and step 7 of the method shown in FIG. 1 will return a "yes" after the last of the devices has gone through steps 1 through 6.

After all instances have been created, step 8 determines whether there are any stacked devices or gates, or complex gates, in the circuit under consideration. If so, the method proceeds to step 9 and calculates the physical shape and position of the stacked devices and gates. The physical shape and position of the layout for each gate in a stacked configuration is calculated in the manner described herein.

At step 10, an overlay step is performed. In the overlay step, the calculated shapes and positions for the stacked devices are used to assemble the components of each of the devices in the stacked group. Specifically, the center point of each of the devices are determined and the components assembled based on those center points.

The next step in the process is a step for customized wiring, including different styles, as shown at step 11. The customized wiring step allows the circuit designer to customize the wiring of the layout by inserting desired wiring configurations. The system also provides an auto wiring technique. The auto wiring can be performed by preexisting tools such as the CELL3 (TM) or DLR (TM) device level routing tool manufactured by Cadence (TM).

A compaction step is then performed, if necessary, to compact the layout to as small an area as possible. Layouts that exceed desired boundaries can be compacted into more dense layouts using preexisting compaction tools, for instance, the compaction tools produced by Cadence. The interface between the program of the present invention and such compacting tool must provide information describing foundries for the cell, pin information and ground rules.

After compaction, the completed layout is output from the system in the form of a data file in a format such as GL1. This GL1 file is ready to ship for mass fabrication.

Figure 2:
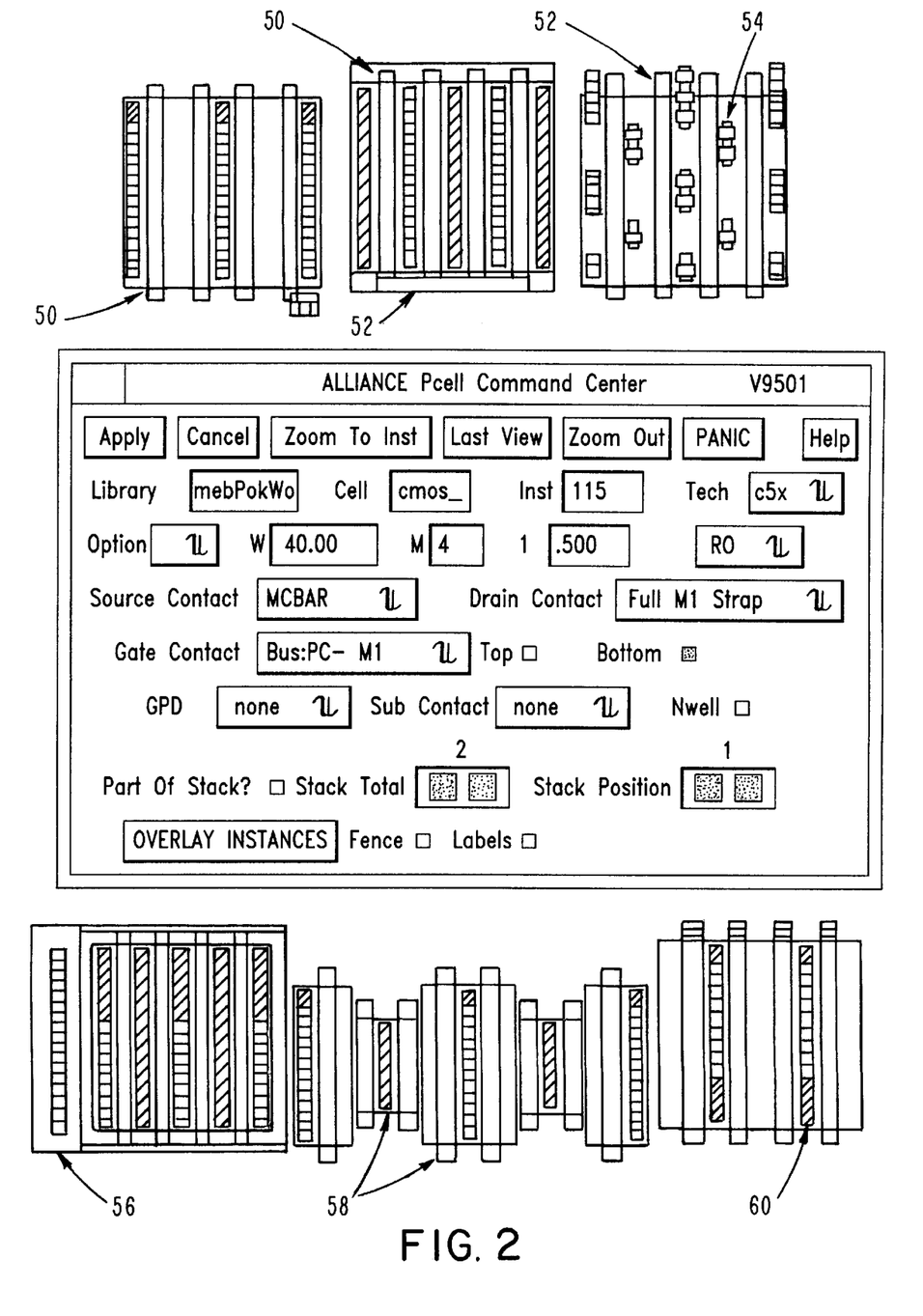
FIG. 2 is a view of a data entry screen in a computer-program based implementation of a method in accordance with the invention.

FIG. 2 shows an example of an interface between a user and a computer programmed to carry out the method in accordance with the invention. Also shown are numerous internal wiring schemes for cells that can be manipulated in accordance with the invention. These examples include: strapped sources and drains 50, gate flanges 52, unique contact structure 54, substrate contacts 56, stacked devices 58 and wiring channels with the ability to accommodate vdd and ground. The creation of these structures uses equations with appropriate stepping distances, and stretches. Using conditional inclusions in each level, the layers can be generated e.g. to create the M1 layer. CA can be conditionally included in the M1 layer. Thus, when M1 is invoked the layers CA and M1 are both drawn with CA covering the M1 without violating ground rules. The default wiring scheme can be set to any level in the program. Once these devices are created, the program proceeds to create stacked devices.

Once a stacked instance is encountered it utilizes a different set of equations. Some examples of stacked (series) devices are nfets in the NAND and pfets in the NOR. It will be clear to those skilled in the art there are many more examples of this. Basically, the stacked instance is broken down into individual instances (either pfet or nfet) which are stacked together. When added nfets are stacked to produce NAND logic, the source of the top of the device stretches to a distance at which the drain of the other device in series would be connected to minimize the capacitance and avoid ground rule violations. If the NAND is a three input device then the devices in the stack are classified as "st", "tt" and "t". Also, the position of the stack is calculated based on the nomenclature of "st", "tt" or "t". The devices are stacked as "st" followed by "tt" and then "t". The equations for the stack involve conditional calls for the amount of trench for diffusion and source regions to minimize the junction capacitance. The stepping of the stack $$(stackstep) = const1 + gatelength * stacktot * 2 + const2 - stackstepadj + (stacktot * 2 - 1) * const3$$

where stackstepadj and the various constants depend on the device type. When the "st" device is invoked a unique position number 1 is assigned to it. For "tt" devices, the position number would be 2, and for device "t" the position number would be 3 and so on. Appropriate stacktotal (total no. of devices) is included based on the device type. The devices thus created in the layout form can be overlaid to create the NAND, NOR, etc., structure.

Using the pointer to the schematic and the width, length and device type information, the layout of each cell can be generated. It is also possible to generate abstract views on the fly and using the wiring router which understands input and output pins the layouts of individual transistors can be wired up (FIG. 1).

Once all the devices are placed and wired, if at all, the individually placed cells then can be compacted. At this point the layout would be completed at the device level.

Figure 3:
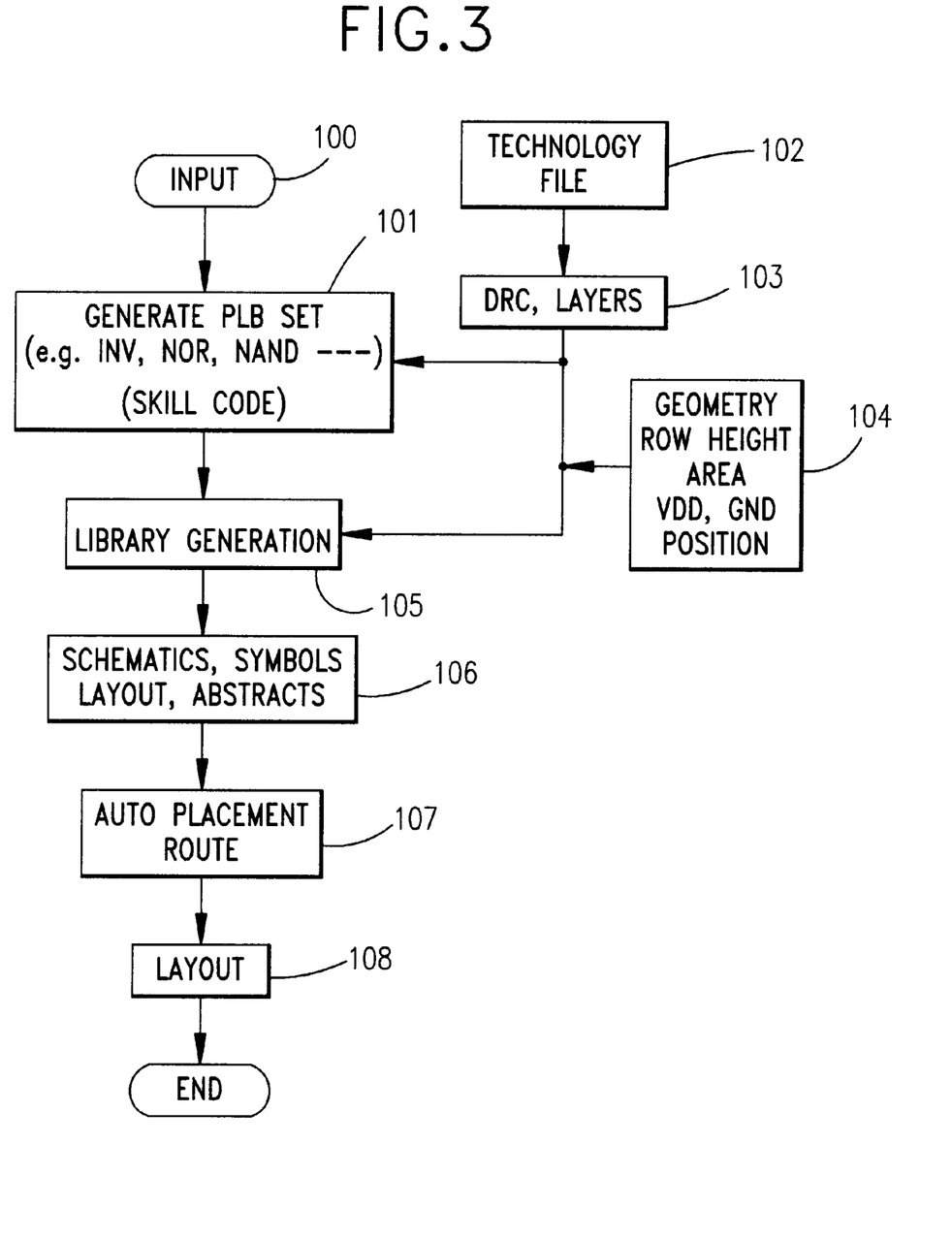
FIG. 3 is a flow diagram describing a method for automatically generating gate level layouts in accordance with the present invention.

A description of a method in accordance with the invention for use with gate level descriptions is given in FIG. 3. (See also Appendix B.)

The input in FIG. 3 is a net list at the gate level. The net list may have been generated by first producing a logic level description of the desired VLSI circuit, the description comprising a series of logic statements describing the function to be implemented by the circuit. This logic level description can then be synthesized into a logic gate circuit diagram. Libraries or library entries corresponding to each of the gates in the circuit would then be called. However, it is the net list for the logic circuit which is provided as the input at step 100 of FIG. 3. In step 101, a programmable library book (PLB) set is generated.

This set can include, for instance, inverters, NOR gates, NAND gates or other complex gates. The PLB set is a set of layouts for each of the logic gates that appear in the logic net list. These layouts can either be computed all at once, meaning all layouts for all logic gates in the library can be computed at the beginning, or the layout can be computed for each gate as it is encountered in computing layouts for the layout circuit or schematic.

A technology file is provided at step 102, the file containing ground rules and layer information for the technology being used (just as in FIG. 1). Also, provided as part of the technology file are design rule checks (step 103). At step 104, the user can provide inputs for desired row height, area, VDD, and ground for the circuit under consideration.

A programmable library book is generated at step 105 by referring to a library file which includes schematic representations for the various gates that may appear in the input gate net list. One option (at step 101) is to generate a hard coded layout library for each power level for each device or gate. A second option is to generate a library on the fly, that is, generate the layout for a particular power level for the gate as needed and based on the delay and timing information of the gates in the net list. Schematics, symbols, layout and abstracts are generated at step 106.

Figure 4:
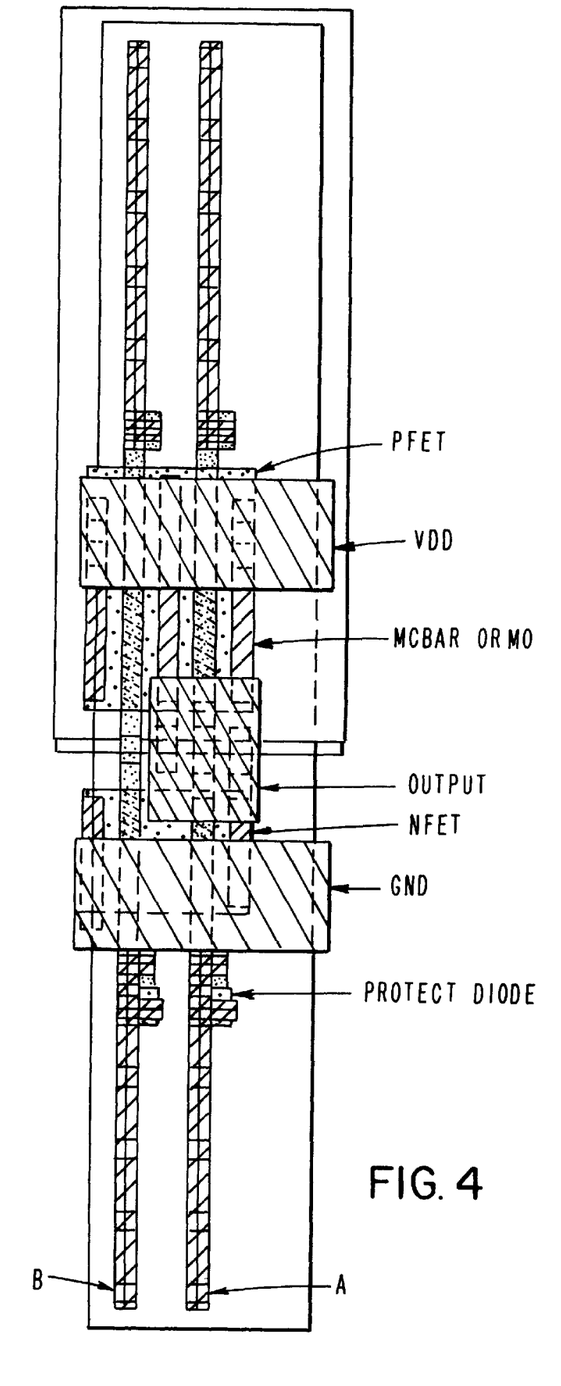
FIG. 4 shows an example of a layout generated automatically in accordance with the invention.
Figure 6:
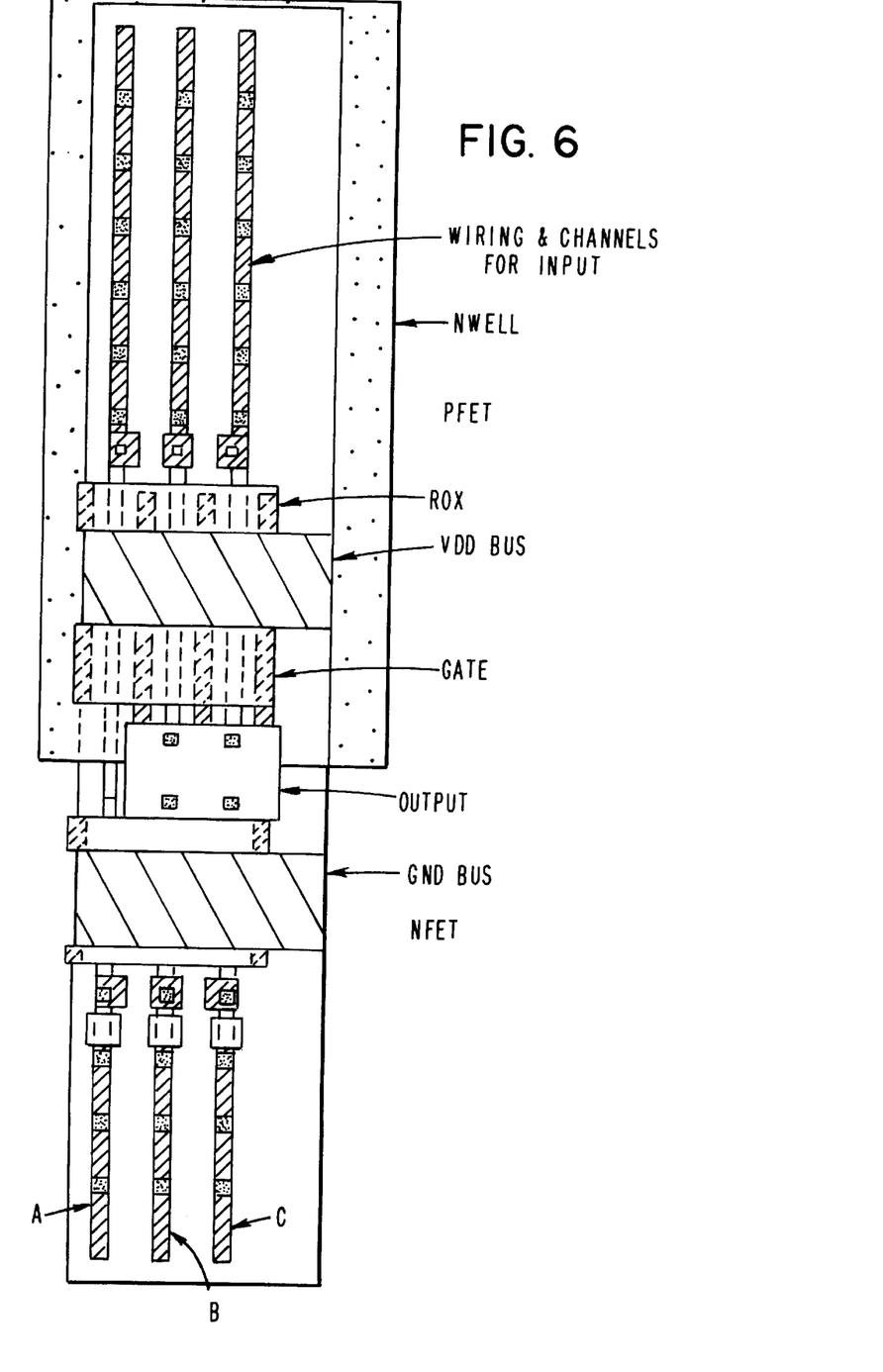
FIG. 6 shows a generated layout for a 3-way NAND.

Auto placement, as described with respect to step 6 of FIG. 1, is then performed at step 107. In step 108, the layout for the schematic is output. In this layout step, unwanted shapes are eliminated and layouts merged together where appropriate. FIG. 4 describes layout generated from 2-way NAND circuit. (FIG. 6 shows a 3-way NAND.) As can be seen there are two inputs to pfets and nfets which are recognized through a pin attribute.

The vdd and ground attribute is shown in the figure and can be varied via the programmable cell configuration. The ground nodes are connected as appropriate by GND bus for nfet and the appropriate source nodes for pfets are connected to the VDD bus. The output nodes for pfet and nfet are connected by the output bus. The size of all these structures can be variable depending on the design, technology and other electromogration requirements.

Figure 5:
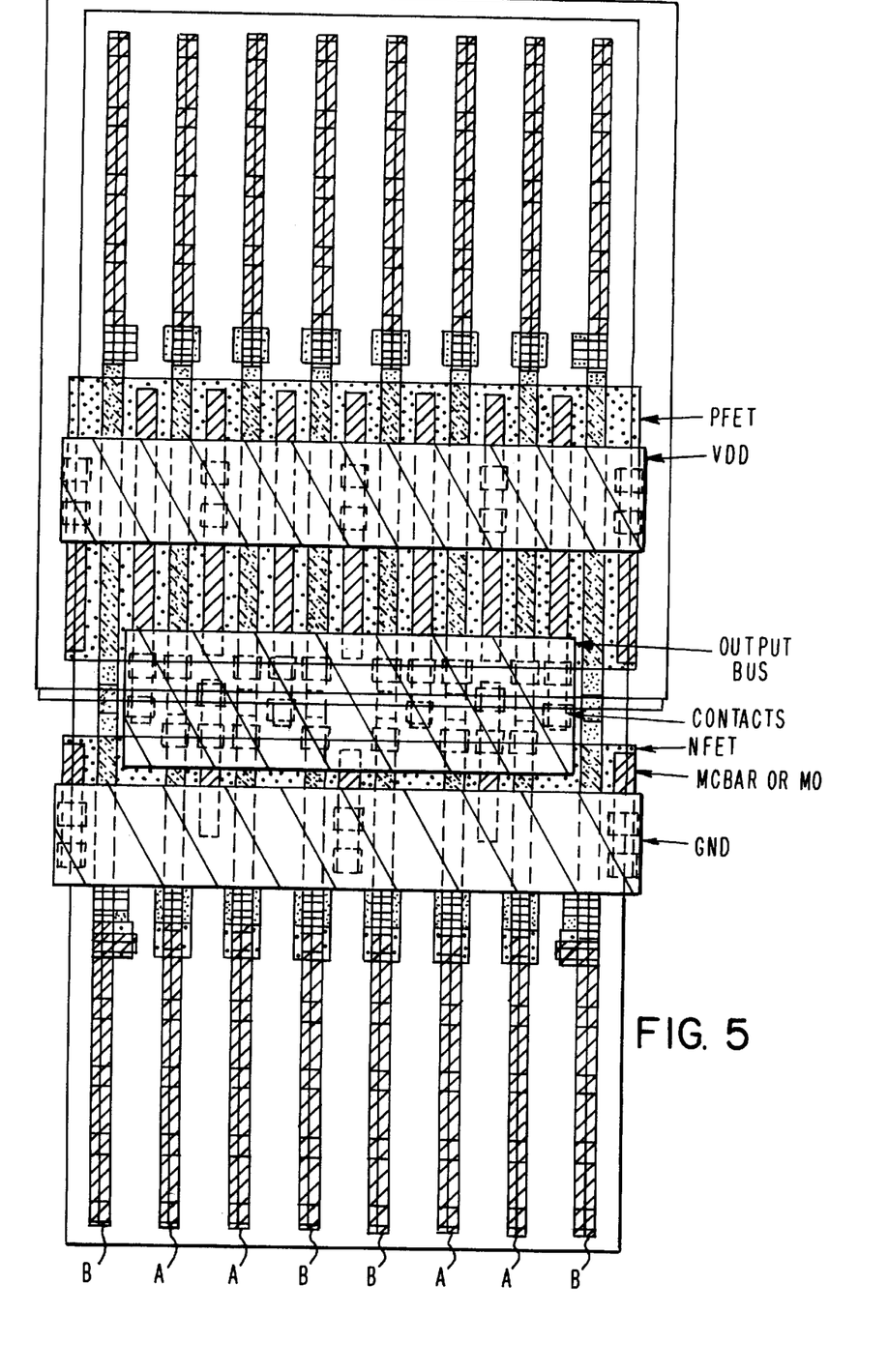
FIG. 5 is another example of a layout generated in accordance with the present invention.
Figure 7:
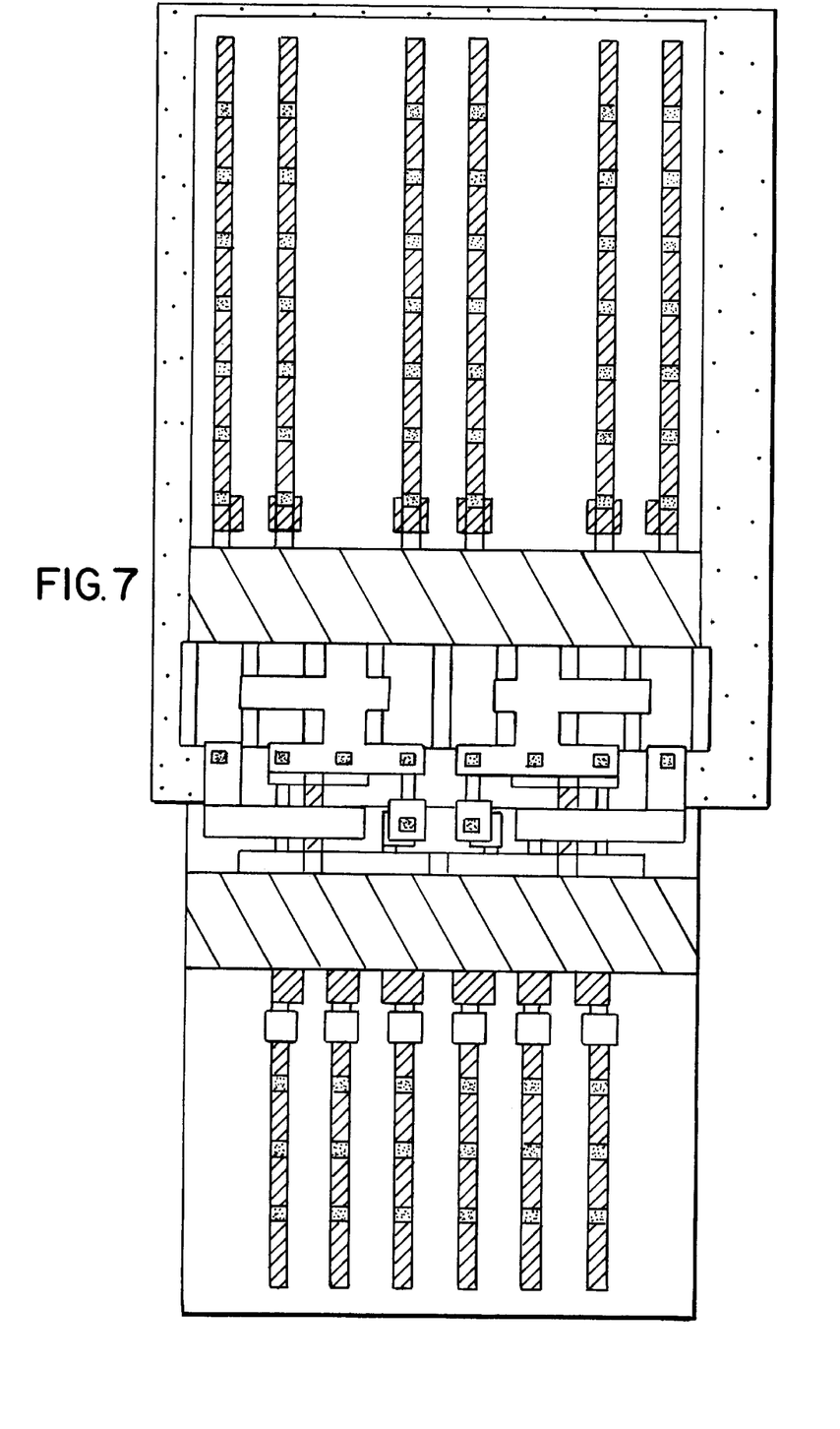
FIG. 7 shows a generated layout for a 3-input NAND with two fingers each.

If the device size becomes too large, it can be split into many fingers. This can be understood with the help of FIG. 5 which shows a 2-input NAND with device having 4 fingers each. (FIG. 7 shows a 3-input NAND with two fingers each.) The fingers help to reduce the resistance of the poly gate wire and lowering the diffusion capacitance. The distance between the gate can be made optimum depending on the device type as illustrated earlier. Using these programmable cells many more complex gates can be created such as AOI(AND or INVERT), OAI(OR and INVERT), INV (inverter), NOR(Negative OR), XOR, REGISTERS and others.

The invention can be implemented by means of programming a general purpose computer in the manner described in the attached appendices A and B which are made a part hereof. A sample code to generate gate level structure is also given in the appendix.

While the invention has been described in particular with respect to preferred embodiments thereof, it will be understood that modifications to the disclosed embodiments can be effected without departing from the spirit and scope of the invention.

We claim:

1. A method for automatically generating a layout of a VLSI circuit, comprising the computer implemented steps of:
   inputting a data file describing the circuit;
   computing one or more parameters of the layout;
   responsive to the computation of one or more parameters, generating a substantially limitless number of shapes representing components of the circuit, said components include multifinger devices, shared devices, and tapered devices having technology dependent spacing;
   placing the shapes in the appropriate configuration;
   computing the shapes in the appropriate configuration;
   if stacked devices are present in the circuit:
      computing the shape and position of the stacked devices;
      computing an overlay position for the stacked devices;
      generating wiring connections and configuration to connect the devices in the layout in the desired fashion; and
      outputting a layout of the circuit.

2. The method of claim 1, wherein the circuit is represented at the gate level in the data file.

3. The method of claim 1, wherein the circuit is represented at the device level in the data file.

4. The method of claim 3, wherein the device level data includes the width (W), length (L) and number of fingers (M) of each device.

5. The method of claim 1, wherein the device level data further comprises the width (W) and length (L) of each device, and wherein the number of fingers of each device (M) is computed automatically.

6. The method of claim 1, further comprising inputting data describing technology rules associated with a technology in which the layout will be generated.

7. The method of claim 1, wherein the step of placing the shapes in an appropriate configuration is performed automatically.

8. The method of claim 7, wherein the shapes are placed automatically based upon circuit timing information.

9. The method of claim 7, wherein the shapes are placed automatically such that circuit wiring delay is minimized.

10. The method of claim 1, wherein the step of placing the shapes is performed by a user of the method.

11. The method of claim 1, further comprising automatically checking the layout for technology design rule violations.

12. The method of claim 1, further comprising cross-checking the layout against the data file describing the circuit to determine whether the entire circuit has been represented in the layout.

13. The method of claim 1, further comprising modifying the wiring connections and configuration in response to user input.

14. The method of claim 1, wherein the step of generating the wiring connections and configuration to connect the devices in the layout in the desired fashion is performed automatically.

15. The method of claim 1, further comprising compacting the layout to occupy as small an area as possible prior to outputting the layout.

16. The method of claim 1, wherein the output representing the layout is in GL1 format.

17. The method of claim 1, further comprising interactively checking the layout during placement.

18. The method of claim 1, further comprising continuously tuning device sizes to achieve performance and area criteria.

19. The method of claim 1, further comprising migrating the layout from one technology to a second technology.

20. A method for automatically generating a layout of a VLSI circuit, comprising the computer implemented steps of:
   inputting a data file containing a gate level description of the circuit;
   generating a substantially limitless number of shapes, programmable library book set containing programmable layouts for each type of gate in the data file;
   providing ground rule and layer information for the technology in which the circuit is to be fabricated;
   inputting desired row height, area, vdd and ground information for the circuit;
   using the programmable layout in the programmable library book, the ground rule and layer information and the input information, generating a second library representing all cells in the circuit;
   generating schematic and symbolic representations of the circuit using the contents of the second library;
   placing symbols representing the elements of the circuit in an appropriate configuration wherein said configuration can be user modifiable or placed automatically; and
   outputting a layout of the circuit containing the appropriately configured shapes.

21. A method for automatically generating a layout of VLSI circuit, comprising the computer implemented steps of:
   inputting a data file describing the circuit, the elements of the circuit being represented at the device level, the device level data comprising the width (W), length (L) and number of fingers (M) of each device;
   inputting data describing technology rules associated with a technology in which the layout will be generated;
   computing one or more parameters of the layout;
   responsive to the computation of one or more parameters, generating a substantially limitless number of shapes, said shapes representing components of the circuit;
   automatically placing the shapes in a appropriate configuration;

automatically checking the layout for technology design rule violations;

cross-checking the layout against the data file describing the circuit to determine whether the entire circuit has been represented in the layout;

if stacked devices are present in the circuit:
  computing the shape and position of the stacked devices;
  computing an overlay position for the stacked devices;

generating the wiring connections and configuration to connect the devices in the layout in the desired fashion;

modifying the wiring connections and configuration in response to user input for reducing wiring parasites;

compacting the layout to occupy as small an area as possible prior to outputting the layout; and outputting a layout of the circuit.

* * * * *